United States Patent [19]

Bellville et al.

[11] Patent Number: 5,939,232
[45] Date of Patent: Aug. 17, 1999

[54] PHOTOSENSITIVE ELEMENTS AND THEIR PROCESS OF USE

[75] Inventors: Dennis James Bellville, Barrington, Ill.; Richard Albert Coveleskie, Sayre, Pa.; Scott Dixon McCalmont, Sayre, Pa.; Harvey Walter Taylor, Jr., Sayre, Pa.; Gregory Charles Weed, Towanda, Pa.

[73] Assignee: E. I. du Pont de Nemours and Company, Wilmington, Del.

[21] Appl. No.: 08/886,627

[22] Filed: Jul. 1, 1997

Related U.S. Application Data

[60] Provisional application No. 60/020,680, Jul. 3, 1996.

[51] Int. Cl.$^6$ ........................................................ G03C 1/73
[52] U.S. Cl. .......................... 430/258; 430/260; 430/262; 430/263
[58] Field of Search .................................... 430/258, 260, 430/262, 263

[56] References Cited

U.S. PATENT DOCUMENTS

| | | | |
|---|---|---|---|
| 3,649,268 | 3/1972 | Chu et al. | 96/27 R |
| 4,053,313 | 10/1977 | Fan | 96/36 |
| 4,174,216 | 11/1979 | Cohen et al. | 430/257 |
| 4,258,247 | 3/1981 | Shimada et al. | 219/137 |
| 4,282,308 | 8/1981 | Cohen et al. | 430/271 |
| 4,489,153 | 12/1984 | Ashcraft et al. | 430/253 |
| 4,719,169 | 1/1988 | Platzer et al. | 430/258 |
| 4,902,504 | 2/1990 | Wilson et al. | 424/84 |
| 4,921,776 | 5/1990 | Taylor, Jr. | 430/293 |
| 4,999,266 | 3/1991 | Platzer et al. | 430/14 |
| 5,001,036 | 3/1991 | Choi | 430/271 |
| 5,019,536 | 5/1991 | Taylor, Jr. | 428/220 |
| 5,028,511 | 7/1991 | Choi | 430/293 |
| 5,071,173 | 12/1991 | Chen et al. | 430/271 |
| 5,087,549 | 2/1992 | Peiffer | 430/253 |
| 5,234,790 | 8/1993 | Lang et al. | 430/253 |
| 5,437,959 | 8/1995 | Hou | 430/256 |
| 5,609,984 | 3/1997 | Hou | 430/256 |
| 5,667,935 | 9/1997 | Hou | 430/256 |
| B1 4,053,313 | 11/1987 | Fan | 430/270 |

FOREIGN PATENT DOCUMENTS

| | | |
|---|---|---|
| 0 260 873 | 3/1988 | European Pat. Off. . |
| 0 386 355 | 6/1993 | European Pat. Off. . |
| 0 664 485 A2 | 7/1995 | European Pat. Off. . |
| 1366769 | 3/1972 | United Kingdom . |
| WO 92/15920 | 9/1992 | WIPO . |

*Primary Examiner*—Janet Baxter
*Assistant Examiner*—Yvette M. Clarke

[57] ABSTRACT

An element containing, in order: a first strippable substrate; a substantially transparent, non-photosensitive, polymeric isolation layer having a coating weight of 10 to 150 mg/dm$^2$; an elastomeric layer having a coating weight of 25 to 200 mg/dm$^2$; a pigmented photosensitive, preferably photopolymerizable layer; and a second different strippable substrate adjacent the photosensitive layer, wherein the photosensitive layer upon imagewise exposure to actinic radiation exhibits a lowered peel force relative to a system which does not have a polymeric isolation layer.

33 Claims, No Drawings

PHOTOSENSITIVE ELEMENTS AND THEIR PROCESS OF USE

This application claims the priority benefit of U.S. Provisional Application No. 60/020,680, filed Jul. 3, 1996.

FIELD OF THE INVENTION

This invention relates to a photosensitive element and more particularly, this invention relates to a photosensitive element having protective polymeric overcoat layers which provide an imaged element having improved adhesion characteristics and low gloss.

BACKGROUND OF THE INVENTION

Photosensitive materials used in color proofing are of the positive- or negative-working types. A positive-working process is described in U.S. Pat. No. 3,649,268 to Chu and Cohen. Positive-working materials may contain tacky, photohardenable compositions which, when exposed imagewise to actinic radiation, harden in the exposed image areas, resulting in tacky and complementary non-tacky image areas. The image can be developed by applying colored particulate materials such as toners or pigments which selectively adhere to the unexposed tacky image areas.

A negative-working process is described in U.S. Pat. No. 4,174,216 to Cohen and Fan, which teaches a negative-working element having a support; a tacky, non-photosensitive contiguous layer; a photohardenable photoadherent layer; and a strippable coversheet. After, imagewise exposure to actinic radiation, the coversheet is peeled away, carrying with it the exposed areas of the photoadherent layer, and bearing the tacky contiguous layer beneath. These areas of the tacky contiguous layer lying underneath the exposed image areas may then be toned with a finely divided particulate material. Different colored layers can be prepared and assembled in register over one another to form multilayer color proofs, as is well known to those skilled in the art. U.S. Pat. No. 4,053,313 to Fan describes a similar negative-working system which is developed by solvent washout.

Alternatively, a photosensitive imaging system may be precolored with dyes and/or pigments or other coloring materials, developed by washout, contain photoplasticizing agents instead of photohardening agents, and other variations known to those skilled in the art. Negative working systems may be achieved in a number of different ways, for example by utilizing a photosensitive layer which becomes tacky and tonable on exposure to actinic radiation. It is understood that in addition to various photopolymer elements, other non-silver halide systems, e.g., diazo systems, are useful in preparing multicolor proofs. In addition the described protective polymer layers of this invention may be beneficially applied to many types of image bearing surfaces, e.g., a conventional silver halide photograph, where it is desired to provide a clear protective covering having a predetermined level of gloss. It is understood that the polymeric layers of the invention may also be applied to nonimaged glossy surfaces to obtain a desired level of lowered gloss.

Prepress color proofs such as those described above are usually covered with one of four types of protective coverings or coversheets. The first of these is a positive-working photosensitive element as described in Cohen and Fan, above, comprising a photosensitive layer and a polyester coversheet. This is exposed overall to actinic radiation and the polyester coversheet removed. This results in a proof with a desirable 20° gloss level of about 65 gloss units. It suffers, however, from poor durability and is susceptible to crazing, scratching and marring.

The second type of topcoat or coversheet is negative-working photosensitive element as described in Cohen and Fan, above, which comprises a polyester cover sheet, a photosensitive layer, and an organic contiguous layer. This is laminated to the proof and exposed overall with the polyester coversheet left in place. The result is a proof with a more durable finish but the gloss associated with the reflective, highly transparent integral polyester coversheet is unacceptably high, i.e., about 107 gloss units measured at 20°. The unacceptability of high gloss has long been recognized, and considerable effort has been focussed on ways to achieve a durable lower gloss protective coating that is resistant to crazing, scratching marring, etc.

The third type of protective coating or coversheet is an integral layer of plastic film, such as polyester, coated with a non-photoactive adhesive, and applied to the proof by lamination. The net result is indistinguishable from the second type of cover sheet above in that it provides a durable coating, but one which exhibits an unacceptably high gloss.

The fourth type of protective topcoat or covering is described in Taylor, U.S. Pat. No. 5,019,536, which comprises a thin substantially transparent, non-photosensitve, integral polymeric layer on a strippable substrate. The polymeric layer comprises a mixture of slightly incompatible polymers. In one embodiment, a wetting layer is provided on the side of the polymeric layer opposite the strippable substrate, and a covering film may be provided over the wetting layer. This film provides the required gloss, however, having two slightly incompatible polymers increases the possibility for variability in coating solutions and therefore variability in the final product. Also, in the embodiment having the wetting layer and the covering film, the product has exhibited unacceptable adhesion, wherein when the covering film is peeled off, part of the wetting layer and polymeric layer are peeled off with it. Further it is incompatible to flammable solvents which poses some environmental concerns.

A need exists for a photosensitive element comprised of layers which have the required low peel force and the required adhesion balance so the element can be developed using peel-apart development.

SUMMARY OF THE INVENTION

The present invention relates to a multilayer element which is useful in the production of multicolor proofs using a stacking method. Surprisingly and unexpectedly, it has been found that an adhesive layer ultimately adjacent to the permanent support of the proof can positively affect or influence the peel or adhesion properties of an adjacent elastomeric layer and photosensitive layer next to the elastomeric layer. The polymeric isolation layer of the photosensitive element of the invention provides the required lower peel force for forming a second, third and fourth pigmented layers for a multicolor proof. Further, the polymeric isolation layer provides the required adhesion to a wide variety of permanent receptors and also provides for the handling of the element in sheet form. The elastomeric layer provides the required adhesion balance between the photosensitive layer and the permanent substrate during processing. Preferably, the polymeric isolation layer and elastomeric layer are soluble in organic solvents and insoluble in aqueous or alkaline aqueous solutions.

The present invention is directed to an element comprising, in order:

(a) a first strippable substrate S1;
(b) a substantially transparent, non-photosensitive, polymeric isolation layer having a coating weight of 10 to 150 mg/dm$^2$, preferably 30 to 100 mg/dm$^2$, more preferably 45 to 60 mg/dm$^2$;
(c) an elastomeric layer having a coating weight of 25 to 200 mg/dm$^2$, preferably 60 to 150 mg/dm$^2$, more preferably 70 to 90 mg/dm$^2$;
(d) a pigmented photosensitive, preferably photopolymerizable layer, and
(e) a second strippable substrate S2 adjacent the photosensitive layer; wherein the photosensitive layer exhibits improved adhesion to the second strippable substrate following imagewise exposure to actinic radiation wherein S1≠S2.

The invention also relates to the element as described above wherein the photosensitive layer is a photopolymerizable layer or the element as above wherein the photosensitive layer has a coating weight of 5 to 50 mg/dm$^2$.

The invention also relates to the element as above wherein the first and second strippable substrates are selected from the group consisting of silicone-treated, electrically discharged (ED), corona-treated, electron beam treated and plasma-treated films selected from the group consisting of polyester, matte finished polyester and polyethylene.

The first strippable substrate may be a silicone release treated polyester film. The second strippable substrate may be selected from an ED treated polyester film. The non-photosensitive, polymeric isolation layer may have a coating weight of 45 to 60 mg/dm$^2$. The non-photosensitive, polymeric isolation layer comprises a vinyl polymer, or comprises an acrylate type thermoplastic polymer.

The elastomeric layer may have a coating weight of 70 to 90 mg/dm$^2$. The elastomeric layer comprises at least one elastomeric polymer, or comprises at least one rubber type polymer.

The invention preferably relates to an element as recited above which is in sheet form.

In a second embodiment, the invention is directed to a process for forming a prepress proof comprising,
(i) providing a photosensitive element comprising, in order,
   (a) a first strippable substrate S1;
   (b) a substantially transparent, non-photosensitive, polymeric isolation layer having a coating weight of 10 to 150 mg/dm$^2$, preferably 30 to 100 mg/dm$^2$, more preferably 45 to 60 mg/dm$^2$;
   (c) an elastomeric layer having a coating weight of 25 to 200 mg/dm$^2$, preferably 60 to 150 mg/dm$^2$, more preferably 70 to 90 mg/dm$^2$;
   (d) a pigmented photosensitive, preferably photopolymerizable, layer; and
   (e) a second strippable substrate S2 adjacent the photosensitive layer, wherein the photosensitive layer exhibits improved adhesion to the second strippable substrate upon imagewise exposure to actinic radiation wherein S1≠S2;
(ii) removing the first substrate S1 and laminating the polymeric isolation layer of the photosensitive element to a permanent support;
(iii) imagewise exposing the photosensitive element to actinic radiation through a color separation to form imaged and non-imaged areas;
(iv) developing the exposed photosensitive element by removing, preferably peeling off, the second strippable substrate S2 to form a colored image on the permanent support wherein removal requires a peel force P2; and
(v) repeating steps (i) to (iv) at least once using a different photosensitive element and a different color separation, and in step (ii), laminating the different photosensitive element to the permanent support having thereon a colored image formed in step (iv); wherein the polymeric isolation layer from the different photosensitive element is adjacent the colored image formed in step (iv).

The invention also relates to the process as described above wherein the peel force is lowered by 300%, or the process as above wherein, in step (ii), the first substrate is peeled off.

The photosensitive layer in the above process may be a photo-polymerizable layer and the photosensitive layer may have a coating weight of 5 to 50 mg/dm$^2$.

The invention also relates to the processes as above wherein the first and second strippable substrates are selected from the group consisting of silicone-treated, electrically discharged (ED), corona-treated, electron beam treated and plasma-treated films selected from the group consisting of polyester, matte finished polyester and polyethylene and includes the process as above wherein the first strippable substrate is a silicone release treated polyester film and the process wherein the second strippable substrate is an ED treated polyester film.

The non-photosensitive, polymeric isolation layer utilized in the above processes may have a coating weight of 45 to 60 mg/dm$^2$ and may be selected from a vinyl polymer or an acrylate type thermoplastic polymer.

The process includes elastomeric layers having a coating weight of 70 to 90 mg/dm$^2$ and includes an elastomeric layer selected from at least one elastomeric polymer or at least one rubber type polymer.

Preferably, the above processes utilize a photosensitive element in sheet form.

The invention also relates to a process wherein a top coat element comprising a substrate and at least one non-photosensitive layer is laminated on the colored image formed in step (iv), with the polymeric isolation layer adjacent the colored image formed in step (iv) or a process wherein a top coat element comprising a substrate and two non-photosensitive layers are laminated on said colored image.

The peel force (P2) required to remove the exposed photopolymerized layer and the second substrate from the elastomeric layer is much less than the peel force required to remove a similarly exposed element which does not have the isolation layer. Applicants' invention is also directed to elements or processes as recited herein wherein a layer adjacent to an elastomeric layer lowers the peel force P2 needed to remove photoexposed material relative to any system which does not have such an additional layer adjacent to an elastomeric layer which would have a peel force P1.

In a third embodiment the invention is directed to a proof comprising, in order:
(a) a permanent substrate;
(b) a substantially transparent, non-photosensitive, polymeric isolation layer having a coating weight of 10 to 150 mg/dm$^2$;
(c) an elastomeric layer having a coating weight of 25 to 200 mg/dm$^2$; and
(d) unexposed image areas of a pigmented photosensitive layer.

In a fourth embodiment, the invention is directed to the proof disclosed above which further comprises:
(e) a substantially transparent, non-photosensitive, polymeric isolation layer having a coating weight of 10 to 150 mg/dm$^2$;

(f) an elastomeric layer having a coating weight of 25 to 200 mg/dm$^2$; and (g) unexposed image areas of a pigmented photosensitive layer; wherein the polymeric isolation layer is adjacent the unexposed image areas of a pigmented photosensitive layer and the uncovered elastomeric layer. Generally, four different pigmented photosensitive elements are used, e.g., black, cyan, magenta and yellow pigmented photosensitive elements. The invention also comprises proofs wherein each additional (g) layer comprises a different colored pigment.

The present invention also relates to a method for lowering the peel force required to remove a coversheet and imagewise exposed photoadherent material in a dry development step of a photosensitive element, comprising, (1) forming a photosensitive element comprising, in order,
   (i) a permanent support;
   (ii) a polymeric isolation layer;
   (iii) an elastomeric layer;
   (iv) a pigmented photosensitive layer; and
   (v) a strippable substrate S2;

(2) imagewise exposing the photosensitive element to actinic radiation through a color separation to form exposed and unexposed areas on a photoexposed element;

(3) developing the photoexposed element by peeling off the strippable substrate S2 and the exposed areas of the photoexposed element with a peel force P2 wherein P2 is less than a peel force P1 required to peel off a strippable substrate S2 and exposed areas of a photoexposed element which does not have a polymeric isolation layer adjacent to the permanent support (i).

The phrase "consisting essentially of" is intended in the present disclosure to have its customary meaning, namely, that the films of the invention are limited to the specified ingredients and other ingredients that do not materially affect the basic and novel characteristics of the compositions claimed. For example, while it is understood that the polymeric isolation layer must contain at least one thermoplastic polymer, other compatible polymers may also be present when needed to achieve a film having a particular set of properties. Preferably, the thermoplastic polymer has a solubility in acetone or toluene of 20 grams per 100 grams of acetone or toluene at 25° C. It is also understood that the compositions may include a variety of additives, such as optical brighteners, anti-oxidants, coating aids, UV light attenuators, etc. In other words, unspecified materials are not excluded so long as they do not prevent the benefits of the invention.

DETAILED DESCRIPTION OF THE INVENTION

The present invention is directed to an element comprising, in order: a first strippable substrate S1; a substantially transparent, non-photosensitive, polymeric isolation layer having a coating weight of 10 to 150 mg/dm$^2$, preferably 30 to 100 mg/dm$^2$, more preferably 45 to 60 mg/dm$^2$; an elastomeric layer having a coating weight of 25 to 200 mg/dm$^2$, preferably 60 to 150 mg/dm$^2$, more preferably 70 to 90 mg/dm$^2$; a pigmented photosensitive, preferably photopolymerizable layer, and a second strippable substrate S2 adjacent the photosensitive layer, wherein the photosensitive layer exhibits improved adhesion to the second strippable substrate when the first strippable substrate is removed, e.g. peeled off.

Strippable Substrates

First and second strippable substrates are provided adjacent the polymeric and photosensitive layers, respectively, to facilitate handling and storage. Such strippable substrates may be particularly useful if the photosensitive layer is to be stored in a roll prior to use. The first strippable substrate would be removed prior to lamination to the permanent support. The photosensitive layer exhibits improved adhesion to the second strippable substrate when the first strippable substrate is removed, e.g., peeled off. The second strippable substrate is removed, preferably peeled off, after the photosensitive element is exposed to actinic radiation. The first and second strippable substrates used in this invention are different so proper adhesion balances are maintained during the process of this invention. Some suitable materials for the first and second strippable substrates as long as they are different (S1≠S2) would include silicone-treated, electrically discharged (ED), corona-treated, electron beam treated or plasma-treated polyester, matte finished polyester or polyethylene, etc., which release readily from the layer they serve to protect. Preferably, the first strippable substrate is silicone release Mylar® polyester film and the second strippable substrate is ED treated Mylar® polyester film, available from E.I. du Pont de Nemours and Company, Wilmington, Del. (DuPont).

Polymeric Isolation Layer

The polymeric isolation layer may have a coating weight of 10 to 100 mg/dm$^2$, preferably 30 to 80 mg/dm$^2$, more preferably 55 mg/dm$^2$. It comprises a thermoplastic polymer, preferably a vinyl-type or an acrylate-type thermoplastic polymer, and optionally UV stabilizers, antioxidants, plasticizers, coating aids, etc. The thermoplastic polymer may have a solubility in acetone or toluene of 20 grams per 100 grams of acetone or toluene at 25° C. The thermoplastic polymer may be used in combination with other compatible thermoplastic polymers to adjust the properties of the polymer to the above outlined limits. By compatible we mean the ability of a mixture of two or more polymers to remain dispersed within one another without segregation or phase separation from each other over time. Preferably, the thermoplastic polymer is used alone because this reduces the possibility of variations in coating solutions which results in variability and lack of reproducibility in the final product.

Some useful vinyl-type thermoplastic polymers include poly vinyl acetate homopolymers or copolymers, polyvinylidine chloride, polyvinyl acetate/ethylene copolymers, polyvinyl acetals such as polyvinyl butyral and polyvinyl formal, etc. Preferably, these polymers are not aqueous alkali soluble. Some useful solvent soluble polymers are sold under the tradenames Vinac resins manufactured by Air Products Company, Wayne, N. J.; Mowilith® resins manufactured by Hoechst Celanese, Charlotte, N.C.; etc. Polyvinyl acetate is preferred.

Alternately, the polymeric isolation layer may comprise an acrylate-type thermoplastic polymer. Some useful acrylate-type thermoplastic polymers include poly(ethyl methacrylate), poly(butyl methacrylate), acrylate and methacrylate copolymers, etc. The preferred thermoplastic polymers include poly(ethyl methacrylate), poly (butylmethacrylate), and methyl methacrylate copolymer. These polymers are sold under the tradenames Elvacite® 2042 polymer, Elvacite® 2044 polymer, Elvacite® 2045 polymer, and Elvacite® 2046 polymer from E.I. du Pont de Nemours and Company, Wilmington, Del., or Carboset® polymers from B.F. Goodrich Co., Brecksville, Ohio.

As is well known to those skilled in the art, commercially available polymers of the type described herein may contain small amounts of other polymerized material. It is intended that the chemical descriptions given are interpreted to mean those polymers that are substantially made up of the monomer(s) indicated. For example, a commercial ethylmethacrylate polymer may contain a few percent of methylmethacrylate. It is contemplated that such copolymers will fall within the invention as disclosed.

The thermoplastic polymer may be used in combination with UV stabilizers, anti-oxidants, etc. Some useful UV stabilizers include benzotriazoles and benzophenones. Some useful anti-oxidants include hindered phenols such as tetrakis[methylene 3-(3,5-di-t-butyl-4-hydroxyphenyl) propionate]methane, and 1,3,5-trimethyl-2,4,6-tris(3,5-di-t-butyl-4-hydroxybenzyl)benzene.

The thermoplastic polymer may be mixed with the optional ingredients and dissolved in an appropriate solvent. One advantage of this invention is that the thermoplastic polymer is soluble in both flammable and non-flammable solvents. Preferred solvents include acetone, tetrahydrofuran and toluene because they are flammable solvents and eliminate the environmental concerns associated with the use of non-flammable solvents.

The coating weight of the polymeric isolation layer should be high enough to insure structural integrity, but low enough to avoid distortion of the image through a three-dimensional effect. In general, the coating weight of the polymeric isolation layer should be in the range of about 10 to 150 mg/dm$^2$, preferably 30 to 100 mg/dm$^2$, more preferably 45 to 60 mg/dm$^2$.

Elastomeric Layer

An elastomeric layer is disposed between the polymeric isolation layer and the photosensitive layer.

The elastomeric layer may be chosen from a great number of materials that will wet or flow into the toned areas. Preferably, this layer will be of a clear, non-photosensitive, tacky or slightly soft deformable organic material. Preferred materials are elastomeric polymers and mixtures thereof. Rubber type polymers, both natural and synthetic may be used, e.g., polyisobutylene Thiokol A, nitrile rubbers, butyl rubber, chlorinated rubbers, polymers of butadiene, poly (vinylisobutylether), and random, teleblock and block copolymers of butadiene or isoprene copolymerized with styrene, and neoprene, silicone elastomers, etc., in various proportions. Especially preferred materials are block copolymers of styrene and butadiene. Additionally, any highly plasticized thermoplastic polymeric isolation layer will function as the elastomeric layer. As is readily apparent to those skilled in the art, the elastomeric layer may also contain such ingredients as tackifiers, anti-oxidants, etc. Any suitable solvent may be used to coat the elastomeric layer provided it is compatible with the solvent used in the polymeric isolation layer. The coating weight of the elastomeric layer may be varied over a wide range and is primarily determined by the other physical property requirements of the system. That is, the minimum coating weight is that which will provide a film with sufficient coating weight to laminate evenly over the imaged surface. The maximum coating weight is that which will provide a film which will not distort the image, i.e., give a three-dimensional appearance. In general, the elastomeric layer should have a coating weight in the range of 25–200 mg/dm$^2$, preferably 60 to 150 mg/dm$^2$, more preferably 70 to 95 mg/dm$^2$.

Photosensitive Layer

The photosensitive layer is one in which the adhesive relationship vis-a-vis the second strippable substrate and elastomeric layer is altered by exposure to actinic radiation. Before exposure to actinic radiation, the photosensitive layer adheres more strongly to the elastomeric layer than the second strippable substrate. If the unexposed element were peeled apart by peeling off the second strippable substrate, the photosensitive layer would remain on the elastomeric layer. However, the exposed areas of the photosensitive layer adhere more strongly to the second strippable substrate than the elastomeric layer and would be removed with the second strippable substrate if it were peeled off.

The pigmented photosensitive layer is preferably photopolymerizable, comprising an ethylenically unsaturated photopolymerizable monomer, a polymeric binder and an initiator of initiator system which initiates free radical addition polymerization on exposure to actinic radiation. The colorant may be a water insoluble colorant such as a pigment or a disperse, or a water soluble dye.

Some suitable monomers, binders, initiators or initiating systems and colorants are disclosed in Assignee's U.S. Pat. No. 5,001,036, the disclosure of which is incorporated herein by reference.

Other additives may be present in the photosensitive layer as long as they are compatible with the other ingredients present in the photosensitive layer and they do not alter the adhesion balance between the elastomeric layer and the second strippable substrate. Such additives include stabilizers, antihalation agents, optical brightening agents, release agents, surfactants coating aids and plasticizers. A thermal polymerization inhibitor may also be present to increase storage stability of the photosensitive element. Some useful additives are disclosed in U.S. Pat. No. 5,001,036, the disclosure of which is incorporated herein by reference.

In general, the photosensitive layer should have a coating weight in the range of 5–50 mg/dm$^2$, preferably 20 to 35 mg/dm$^2$.

Process of Manufacture

The element of the invention is prepared by applying, preferably coating, the polymeric isolation layer and the elastomeric layer on a first strippable substrate. Any method and apparatus known to one skilled in the art may be used in applying these layers. For example, the first strippable substrate may be coated with the polymeric isolation layer and the elastomeric layer by roller coating, spray coating, gravure coating, slot coating, or extrusion coating, preferably extrusion coating. The polymer and elastomeric layers may be applied one at a time with the first applied layer being dried before application of the second layer or the layers may be coated simultaneously.

Preferably, the photosensitive layer is coated on the second strippable substrate and then laminated to the previously prepared element having an elastomeric layer, polymer layer and first substrate with the elastomeric layer adjacent the photosensitive layer. Alternately, the photosensitive layer may be coated on the dried surface of the elastomeric layer and the second strippable substrate may be laminated to it. It is important that the second strippable substrate have greater adhesion to the photosensitive layer than the first strippable substrate to the isolation layer.

Process of Use

The invention also includes a process for forming a prepress proof comprising, in order:
 (i) providing a photosensitive element comprising in order:

(a) a first strippable substrate S1;
(b) a substantially transparent, non-photosensitive, polymeric isolation layer having a coating weight of 10 to 150 mg/dm², preferably 30 to 100 mg/dm², more preferably 45 to 60 mg/dm²;
(c) an elastomeric layer having a coating weight of 25 to 200 mg/dm², preferably 60 to 150 mg/dm², more preferably 70 to 95 mg/dm²;
(d) a pigmented photosensitive, preferably photopolymerizable, layer; and
(e) a second strippable substrate S2 adjacent the photosensitive layer, wherein the photosensitive layer exhibits improved adhesion to the second strippable substrate upon imagewise exposure to actinic radiation;

(ii) peeling off the first substrate and laminating the polymeric isolation layer of the photosensitive element to a permanent support;

(iii) imagewise exposing the photosensitive element to actinic radiation through a color separation to form imaged and non-imaged areas; and (iv) developing the exposed photosensitive element by removing, preferably peeling off, the second strippable substrate S2 along with the exposed areas of the photosensitive layer to form a colored right reading image on the permanent support.

To form a four color proof, steps (i)–(iv) are repeated using a different pigmented photosensitive element and the corresponding color separation, and laminating the different pigmented photosensitive element to the previously formed colored image(s) on the receptor formed in step (iv) in step (i) to yield a four color proof on the receptor. Preferably, the pigmented photosensitive layer is photopolymerizable.

The four color proof may then be laminated with a top coat element similar to that described in U.S. Pat. No. 5,437,959 issued Aug. 1, 1995 or U.S. Pat. No. 4,921,776 issued May 1, 1990, the disclosures of which are incorporated herein by reference. The top coat element may comprise one or two non-photosensitive layers on a substrate. The preferred process utilizes a photosensitive element in sheet form (versus roll) and a sheet laminator to produce the multicolor proofs.

EXAMPLES

Four photosensitive elements were prepared comprising, in order, a silicone release Mylar® polyester film substrate; a polymer layer containing 100% Vinac® B-15 polymer (manufactured by Air Products Co., Wayne, N.J.), having a coating weight of 50 to 60 mg/dm²; an elastomeric layer containing 100% of Duradene® 709, Firestone Synthetic Rubber & Latex Co., Akron, Ohio, having a coating weight of 80 to 90 mg/dm²; a pigmented photosensitive layer and an ED treated Mylar® polyester film substrate.

The pigmented photosensitive layers had the following compositions:

| INGREDIENT | AMOUNT | | | |
|---|---|---|---|---|
| | Magenta | Cyan | Black | Yellow |
| Quindo® Magenta RV-6850, Bayer, Pittsburgh, PA | 10.5 | 0.3 | | |
| Indofast® Brilliant Scarlet, Bayer, Pittsburgh, PA | 2.2 | | | 0.1 |
| Heliogen® Blue L 7101 F, BASF, Mt. Olive, NJ | | 6.4 | | |
| Cromaphtal® Yellow 3G, Ciba-Geigy Corp., Newport, DE | | | | 10.6 |
| Raven® 450/Raven 1035 (50/50), Columbia Corp., Jamesburg, NJ | | | 11.3 | |
| Elveron® 6037, DuPont | 7.2 | 2.3 | 5.6 | 2.7 |
| Elvacite® 2051, DuPont | 27.3 | 38.6 | 33.6 | 35.1 |
| Sartomer® PRO-823, Sartomer Corp., West Chester, PA. | 42.0 | 43.0 | 42.0 | 41.3 |
| Fluorad® FC-430, 3M Co., Minneapolis, MN | 0.1 | 0.1 | 0.1 | 0.1 |
| Polyox® WSR N-3000, Union Carbide, New York, NY | 0.7 | 0.7 | 0.7 | 0.7 |
| O-Chloro-HABI | 3.6 | 3.5 | 3.0 | 3.4 |
| 2-MBO | 1.9 | 1.7 | 1.7 | 1.7 |
| Calcafluor® White, BASF Corp., Parsippany, NJ | 2.4 | 1.7 | 2.0 | 2.3 |
| Uvitex® OB, Co., Ciba-Geigy Corp., Ardsley, NY | 2.1 | 1.7 | | 2.0 |

A four color proof was prepared using black, cyan, magenta and yellow pigmented photosensitive elements, respectively, and the following procedure:

(i) the silicone release Mylar® polyester film was peeled off, and the black pigmented photosensitive element was laminated to a plastic coated paper receptor with the Vinac® B-15 polymer containing layer adjacent the receptor;

(ii) the so laminated element was exposed with ultraviolet light under vacuum with a positive separation (black) on top of the ED treated Mylar® polyester film substrate for 10 seconds with 5 Kw light;

(iii) the ED treated Mylar® polyester film substrate was peeled off leaving behind an unexposed, black, right-reading image on the receptor; and (iv) steps (i)–(iii) were repeated using cyan, magenta and yellow pigmented photosensitive elements as described above and the corresponding color separations, and laminating, in step (i), the cyan, magenta and yellow pigmented photosensitive elements to the previously formed colored image(s) on the receptor to yield a four color proof on the receptor.

The four color proof was then laminated with a top coat element similar to that described in U.S. Pat. No. 5,437,959 issued Aug. 1, 1995.

The results show that the isolation layer present as part of the cyan, magenta and yellow pigmented photosensitive elements significantly influenced the peel force between the elastomeric layer and the photoexposed areas of the photosensitive layer of said photosensitive element. The peel force P2 required to develop the imagewise exposed element to form the positive proof was 250 grams per linear inch. Likewise, the cyan, magenta and yellow pigmented photosensitive elements without a polymeric isolation layer demonstrated a peel force P1 of 800 grams per linear inch. Lowered peel force provides significant advantages to producing multicolor proofs according to the processes described herein.

What is claimed is:

1. An element comprising, in order:
   (a) a first strippable substrate;
   (b) a substantially transparent, non-photosensitive, polymeric isolation layer having a coating weight of 10 to 100 mg/dm²;

(c) an elastomeric layer having a coating weight of 25 to 200 mg/dm$^2$;

(d) a pigmented photosensitive layer; and (e) a second strippable substrate adjacent the photosensitive layer, wherein the element excludes an adhesive layer between the first strippable layer and the isolation layer;

wherein the photosensitive layer exhibits improved adhesion to the second strippable substrate when the first strippable substrate is removed.

2. The element of claim 1 wherein the photosensitive layer is a photopolymerizable layer.

3. The element of claim 1 wherein the photosensitive layer has a coating weight of 5 to 50 mg/dm$^2$.

4. The element of claim 1 wherein the first and second strippable substrates are selected from the group consisting of silicone-treated, electrically discharged (ED), corona-treated, electron beam treated and plasma-treated films selected from the group consisting of polyester, matte finished polyester and polyethylene.

5. The element of claim 4 wherein the first strippable substrate is a silicone release treated polyester film.

6. The element of claim 4 wherein the second strippable substrate is an ED treated polyester film.

7. The element of claim 1 wherein the non-photosensitive, polymeric isolation layer has a coating weight of 45 to 60 mg/dm$^2$.

8. The element of claim 1 wherein the non-photosensitive, polymeric isolation layer comprises a vinyl polymer.

9. The element of claim 1 wherein the non-photosensitive, polymeric isolation layer comprises an acrylate type thermoplastic polymer.

10. The element of claim 1 wherein the elastomeric layer has a coating weight of 70 to 90 mg/dm$^2$.

11. The element of claim 1 wherein the elastomeric layer comprises at least one elastomeric polymer.

12. The element of claim 1 wherein the elastomeric layer comprises at least one polymer selected from synthetic rubbers and natural rubbers.

13. The element of claim 1 wherein the photosensitive element is in sheet form.

14. A process for forming a prepress proof comprising, in order:

(i) providing a pigmented photosensitive element comprising in order from top to bottom:
  (a) a first strippable substrate;
  (b) a substantially transparent, non-photosensitive, polymeric isolation layer having a coating weight of 10 to 150 mg/dm$^2$;
  (c) an elastomeric layer having a coating weight of 25 to 200 mg/dm$^2$;
  (d) a pigmented photosensitive layer; and
  (e) a second strippable substrate adjacent the photosensitive layer, wherein the element excludes an adhesive layer between the first strippable layer and the isolation layer, wherein the photosensitive layer exhibits improved adhesion to the second strippable substrate when the first strippable substrate is removed;

(ii) removing the first substrate and laminating the photosensitive element to a permanent support;

(iii) imagewise exposing the photosensitive element to actinic radiation through a color separation to form imaged and non-imaged areas; and (iv) developing the exposed photosensitive element by removing the second strippable substrate to form a colored image on the permanent support;

(v) repeating steps (i) to (iv) at lease once using a different photosensitive element and a different color separation, and in step (ii), laminating the different photosensitive element to the permanent support having thereon a colored image formed in step (iv); wherein the polymer isolation layer from the different photosensitive element is adjacent the colored image formed in step (iv), and wherein the polymer isolation layer lowers the peel force between the elastomeric layer and the colored image areas of the photosensitive layer resulting from step (iv).

15. The process of claim 14 wherein the peel force is lowered by 300%.

16. The process of claim 14 wherein, in step (ii), the first substrate is peeled off.

17. The process of claim 14 wherein the photosensitive layer is a photopolymerizable layer.

18. The process of claim 14 wherein the photosensitive layer has a coating weight of 5 to 50 mg/dm$^2$.

19. The process of claim 14 wherein the first and second strippable substrates are selected from the group consisting of silicone-treated, electrically discharged (ED), corona-treated, electron beam treated and plasma-treated films selected from the group consisting of polyester, matte finished polyester and polyethylene.

20. The process of claim 19 wherein the first strippable substrate is a silicone release treated polyester film.

21. The process of claim 19 wherein the first strippable substrate is an ED treated polyester film.

22. The process of claim 14 wherein the non-photosensitive, polymeric isolation layer has at coating weight of 45 to 60 mg/dm$^2$.

23. The process of claim 14 wherein the non-photosensitive, polymeric isolation layer comprises a vinyl polymer.

24. The process of claim 14 wherein the non-photosensitive, polymeric isolation layer comprises an acrylate type thermoplastic polymer.

25. The process of claim 14 wherein the elastomeric layer has a coating weight of 70 to 90 mg/dm$^2$.

26. The process of claim 14 wherein the elastomeric layer comprises at least one elastomeric polymer.

27. The process of claim 14 wherein the elastomeric layer comprises at least one rubber type polymer.

28. The process of claim 14 wherein the photosensitive element is in sheet form.

29. The process of claim 14 wherein the top coat element comprising a substrate and at least one non-photosensitive layer is laminated on the colored image formed in step (iv), with the polymeric isolation layer adjacent the colored image formed in step (iv).

30. The process of claim 14 wherein a top coat element comprising a substrate and two non-photosensitive layers.

31. A proof comprising, in order:
(a) a permanent substrate;
(b) a substantially transparent, non-photosensitive, polymeric isolation layer having a coating weight of 10 to 150 mg/dm$^2$;
(c) an elastomeric layer having a coating weight of 25 to 200 mg/dm$^2$; and (d) unexposed image areas of a pigmented photosensitive layer, wherein the element excludes an adhesive layer between the first strippable layer and the isolation layer.

32. The proof of claim 31 further comprising:
(e) a substantially transparent, non-photosensitive, polymer isolation layer having a coating weight of 10 to 150 mg/dm$^2$;
(f) an elastomeric layer having a coating weight of 25 to 200 mg/dm$^2$; and
(g) unexposed, image areas of a pigmented photosensitive layer; wherein the polymeric isolation layer is adjacent the unexposed image areas of a pigmented photosensitive layer and the uncovered elastomeric layer.

33. The proof of claim 32 comprising additional (e), (f) and (g) layers, wherein each additional (g) layer comprises a different colored pigment.

* * * * *